(12) United States Patent  
Kim

(10) Patent No.: US 8,400,381 B2  
(45) Date of Patent: Mar. 19, 2013

(54) ANALOG OUTPUT BUFFER CIRCUIT AND ORGANIC LIGHT EMITTING DISPLAY USING THE SAME

(75) Inventor: Do-youb Kim, Suwon (KR)

(73) Assignee: Samsung Display Co., Ltd., Yongin-si (KR)

( * ) Notice: Subject to any disclaimer, the term of this patent is extended or adjusted under 35 U.S.C. 154(b) by 959 days.

(21) Appl. No.: 12/013,365

(22) Filed: Jan. 11, 2008

(65) Prior Publication Data

US 2008/0252633 A1  Oct. 16, 2008

(30) Foreign Application Priority Data

Apr. 12, 2007  (KR) ......................... 10-2007-0036064

(51) Int. Cl.  
*G09G 3/32* (2006.01)

(52) U.S. Cl. .......................................... 345/82; 345/98

(58) Field of Classification Search .................. 345/211, 345/76–80, 82, 98, 100; 34/211; 257/66, 257/67; 327/108, 112  
See application file for complete search history.

(56) References Cited

U.S. PATENT DOCUMENTS

| 2004/0183772 | A1 | 9/2004 | Nakajima et al. | |
|---|---|---|---|---|
| 2006/0125759 | A1* | 6/2006 | An | 345/98 |
| 2006/0186932 | A1* | 8/2006 | Lin et al. | 327/108 |
| 2006/0220942 | A1* | 10/2006 | Choi et al. | 341/172 |

FOREIGN PATENT DOCUMENTS

| JP | 2000-194327 | 7/2000 |
|---|---|---|
| JP | 2005-189379 | 7/2005 |
| JP | 2005-331774 | 12/2005 |
| KR | 10-2005-0009977 | 1/2005 |
| KR | 10-2006-0027169 | 3/2006 |
| KR | 10-2006-0064194 | 6/2006 |
| KR | 10-2007-0019463 | 2/2007 |

OTHER PUBLICATIONS

Bigelow, Ken. CMOS Logic via Web Archive [online]. Feb. 12, 2003 [retrieved on Oct. 21, 2010]. Retrieved from the Internet: <URL:http://web.archive.org/web/20030212204348/http://www.play-hookey.com/digital/electronics/cmos_gates.html>.*  
Patent Abstracts of Japan, Publication No. 2000-194327; Date of Publication: Jul. 14, 2000; in the name of Masao Karibe.  
Korean Patent Abstracts, Publication No. 1020060027169 A; Date of Publication: Mar. 27, 2006; in the name of Oh Kyong Kwon.

* cited by examiner

*Primary Examiner* — Chanh Nguyen  
*Assistant Examiner* — Jonathan Blancha  
(74) *Attorney, Agent, or Firm* — Christie, Parker & Hale, LLP

(57) ABSTRACT

An analog output buffer circuit is provided. A first transistor has a source, drain, and gate coupled to a first node, a second node, and a third node, respectively. A second transistor is coupled between the second node and the third node. The second transistor has a gate coupled to a first control line. A third transistor has a source coupled to a data line, a drain coupled to the first node, and a gate coupled to the first control line. A fourth transistor has a source coupled to the second node, a drain coupled to an output terminal, and a gate coupled to a second control line. A fifth transistor has a source coupled to the first node, a drain coupled to a first power supply, and a gate coupled to the second control line. A capacitor is coupled between the third node and the first power supply.

12 Claims, 5 Drawing Sheets

ANALOG OUTPUT BUFFER CIRCUIT AND ORGANIC LIGHT EMITTING DISPLAY USING THE SAME

CROSS-REFERENCE TO RELATED APPLICATION

This application claims priority to and the benefit of Korean Patent Application No. 10-2007-0036064, filed on Apr. 12, 2007, in the Korean Intellectual Property Office, the entire content of which is incorporated herein by reference.

BACKGROUND

1. Field of the Invention

The present invention relates to an analog output buffer circuit and an organic light emitting display using the same.

2. Discussion of Related Art

As the technique relating to thin film transistors has recently been developed together with the development of a semiconductor technique, an active matrix type flat panel display displaying images by using thin film transistors has widely been used. In addition, an organic light emitting display has been developed that has excellent luminous efficiency and brightness, an improved viewing angle, and a rapid response speed.

The organic light emitting display displays images by using a plurality of organic light emitting diodes (OLEDs), wherein the OLED includes an anode electrode, a cathode electrode, and an organic light emitting layer positioned between the anode electrode and the cathode electrode for emitting light by coupling electrons and holes.

The semiconductor layer of the thin film transistor used in the active matrix type flat panel display uses poly-silicon, or the like. However, when using poly-silicon, a process deviation inevitably occurs. If thin film transistors are formed of poly-silicon, a difference in threshold voltage, mobility, and other transistor characteristics for each thin film transistor will occur. Such a difference in the transistor characteristics makes high speed circuit operation difficult and increases component sizes such that the area of the circuit is increased.

FIG. 1 shows a conventional source follower wherein errors occur by threshold voltage Vth in output voltage Vout as compared to input voltage Vin as shown in the following mathematical equation 1.

$$V_{out} = V_{in} - V_{th}$$  Mathematical Equation 1

FIG. 2 shows a comparator type of an analog output buffer, wherein the output buffer has rapid speed and accuracy with low error. However, the output buffer has disadvantages of a complex structure and high power consumption in implementing the comparator.

SUMMARY OF THE INVENTION

Therefore, the present invention has been proposed in order to solve the above problem. Exemplary embodiments of the present invention provide an analog buffer and an organic light emitting display thereof constituted by a source follower having low power consumption and compensating for threshold voltage.

According to a first aspect of the present invention, an analog output buffer circuit is provided. A first transistor has a source coupled to a first node, a drain coupled to a second node, and a gate coupled to a third node. A second transistor is coupled between the second node and the third node such that the first transistor is diode-coupled when the second transistor is on. The second transistor has a gate coupled to a first control line. A third transistor has a source coupled to a data line, a drain coupled to the first node, and a gate coupled to the first control line. A fourth transistor has a source coupled to the second node, a drain coupled to an output terminal, and a gate coupled to a second control line. A fifth transistor has a source coupled to the first node, a drain coupled to a first power supply, and a gate coupled to the second control line. A capacitor is coupled between the third node and the first power supply.

In an exemplary embodiment of the present invention, a sixth transistor is coupled to a first electrode of the capacitor and an initialization power supply to transfer an initialization voltage to the first electrode of the capacitor.

In an exemplary embodiment of the present invention, a seventh transistor is coupled between the output terminal and a second power supply having a voltage greater than the first power supply such that the voltage of the second power supply is transferred to the output terminal when the seventh transistor is turned on by the initialization voltage.

In an exemplary embodiment of the present invention, a voltage of the second node is outputted to the output terminal if the voltage of the second node is greater than a voltage of the third node by a threshold voltage of the first transistor.

According to a second aspect of the present invention, a data driver is provided. The data driver includes a shift register for serially outputting control signals, a latch unit for receiving digital data signals serially according to the control signals and for outputting the digital data signals in parallel, a D/A converter for converting the digital data signals into data voltages, and an analog output buffer circuit for outputting the data voltages.

According to a third aspect of the present invention, an organic light emitting display is provided. The organic light emitting display includes a display area for receiving data signals and scan signals and displaying images, a data driver for transferring the data signals to the display area, and a scan driver for transferring the scan signals to the display area.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF EXEMPLARY EMBODIMENTS

Figure 1:
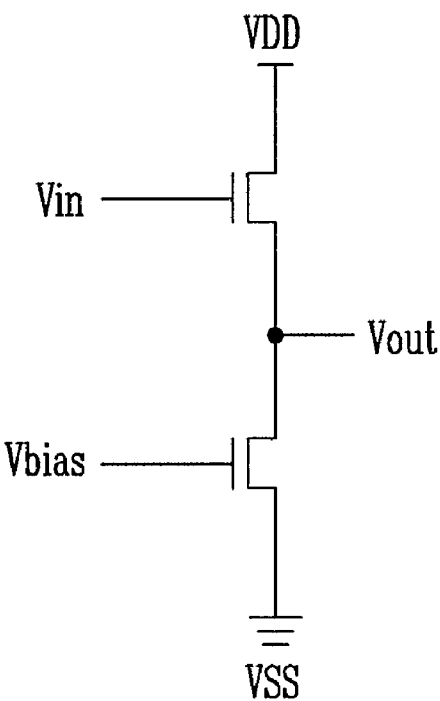
FIG. 1 is a circuit view showing a conventional source follower.

In the following detailed description, only certain exemplary embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

The present invention relates to an analog output buffer circuit and an organic light emitting display using the same that makes output signals of the buffer uniform by reducing errors due to the transistor threshold voltage.

Figure 3:
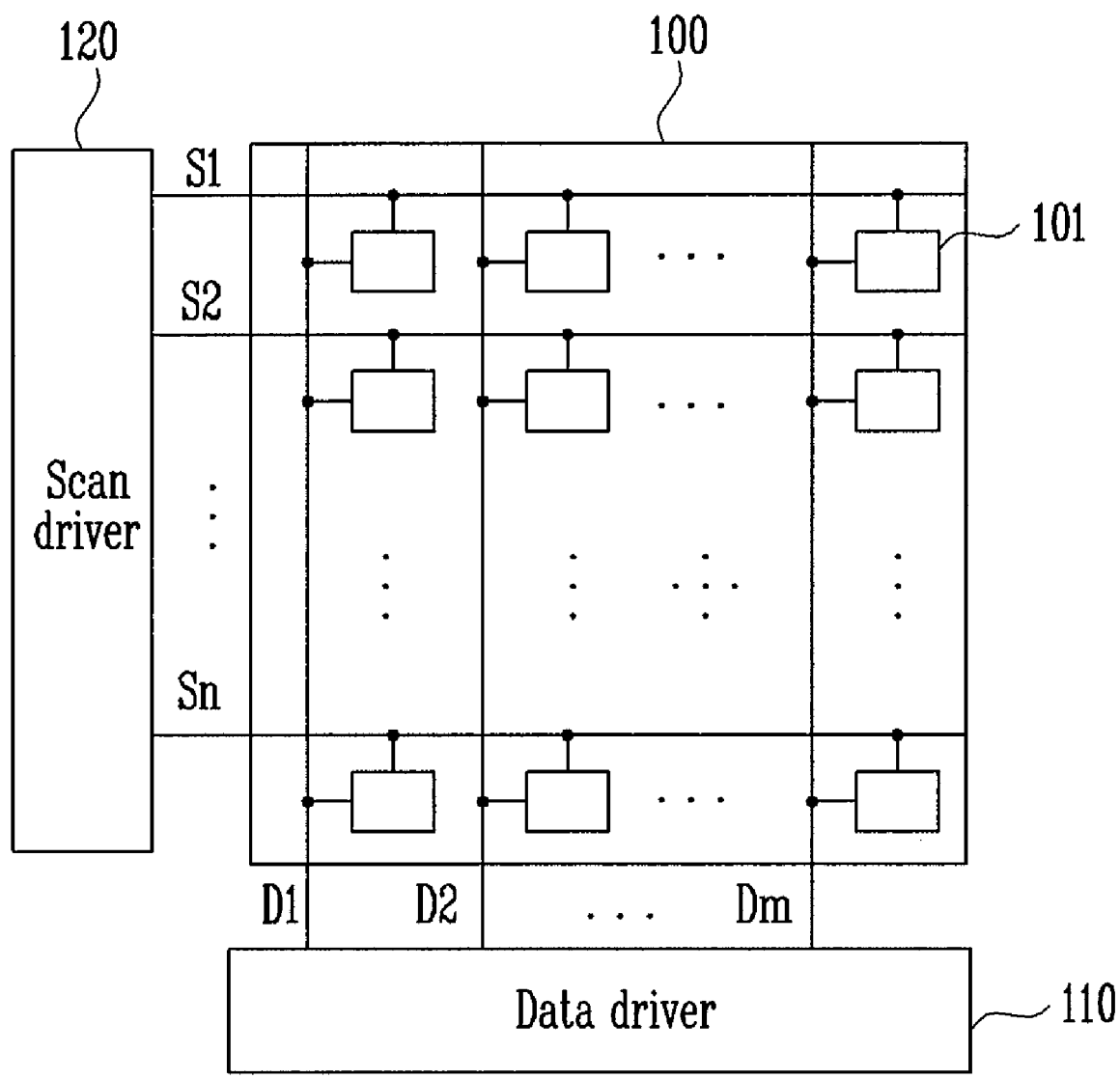
FIG. 3 is a structure view showing a structure of an organic light emitting display according to an exemplary embodiment of the present invention.

FIG. 3 is a view showing a structure of an organic light emitting display according to an exemplary embodiment of the present invention. Referring to FIG. 3, the organic light emitting display includes a display area 100, a data driver 110, and a scan driver 120.

The display area 100 includes a plurality of pixels 101 arranged thereon, each pixel 101 including an OLED for emitting light corresponding to the flow of current. And, n scan lines S1, S2, . . . , Sn–1, Sn, extending in a row direction and transferring scan signals, and m data lines D1, D2, . . . , Dm–1, Dm, extending in a column direction and transferring data signals, are arranged thereon. Also, the display area 100 is driven by receiving a first external power supply ELVDD and a second external power supply ELVSS. The OLED is light emitted using the scan signals, the data signals, the first power supply ELVDD, and the second power supply ELVSS such that the display area 100 displays images.

The data driver 110, which is used for applying the data signals to the display area 100, generates the data signals by receiving video data having the components of red, blue, and green. The data driver 110 is coupled to the data lines D1, D2, . . . , Dm–1, Dm of the display area 100 to apply the generated data signals to the display area 100.

The scan driver 120, which is used for applying the scan signals to the display area 100, is coupled to the scan lines S1, S2, . . . , Sn–1, Sn to transfer the scan signals to a row (e.g., a predetermined row) of the display area 100. The data signals output from the data driver 110 are transferred to the pixel 101 to which the scan signals are transferred so that a driving current is generated in the pixel to be flowed to the OLED.

Figure 4:
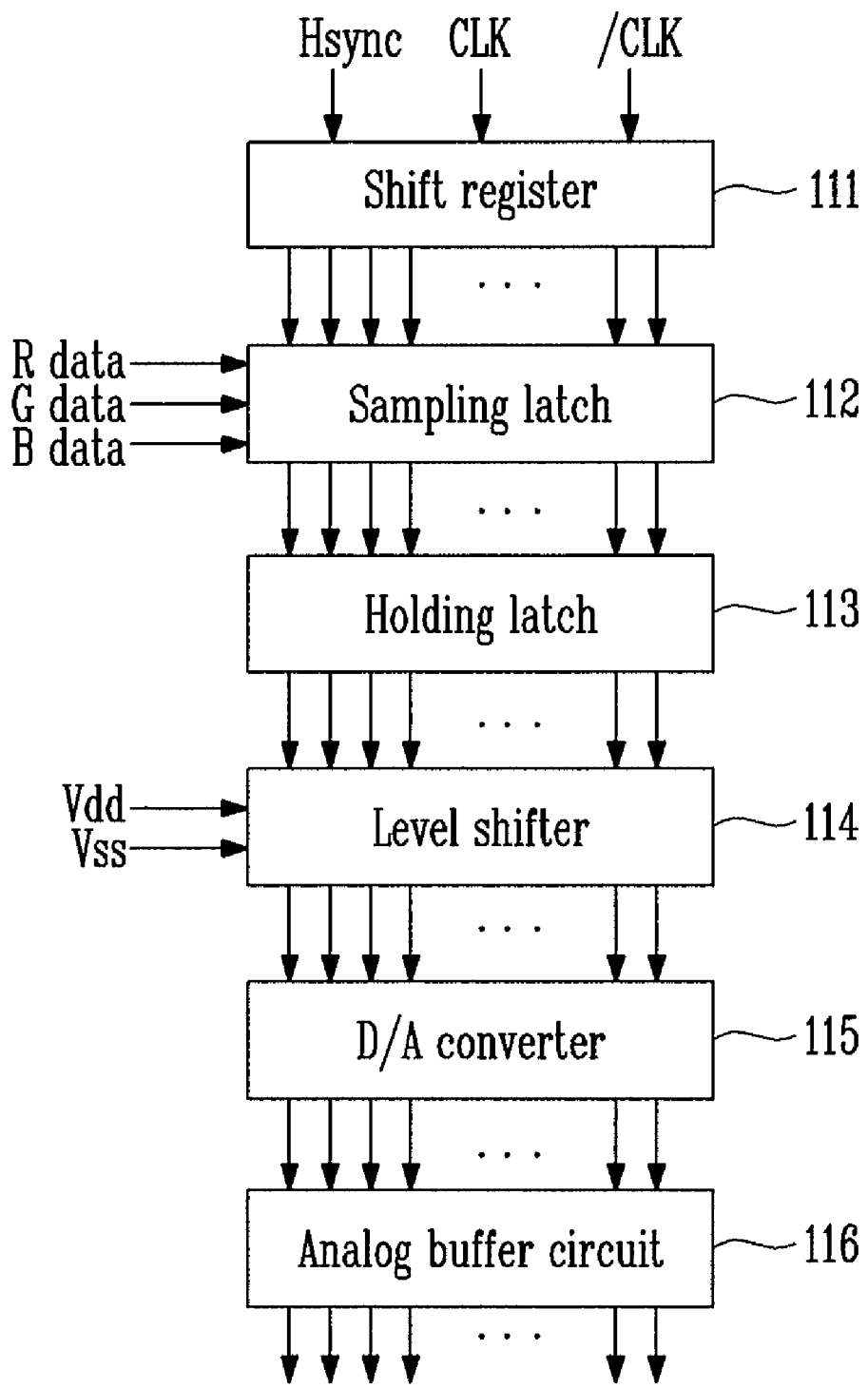
FIG. 4 is a structure view showing a structure of a data driver used in the organic light emitting display as shown in FIG. 3.

FIG. 4 is a structure view showing a structure of a data driver used in the organic light emitting display as shown in FIG. 3. Referring to FIG. 4, the data driver 110 includes a shift register 111, a sampling latch 112, a holding latch 113, a level shifter 114, a D/A converter 115, and an analog output buffer circuit 116.

The shift register 111 includes a plurality of flip-flops and controls the sampling latch 112 corresponding to clock signals CLK and synchronizing signals Hsync. The sampling latch 112 serially receives one row of the data signals according to the control signals of the shift register 111 and outputs the signals in parallel. The scheme of serially receiving the signals and outputting the signals in parallel is referred to as serial-in-parallel-out (SIPO). The holding latch 113 receives the signals in parallel and outputs the signals in parallel. The scheme of receiving the signals in parallel and outputting the signals in parallel is referred to as parallel-in-parallel-out (PIPO). The level shifter 114 changes a level of the signal outputted from the holding latch 113 into a level of operation voltage of a system to transfer it to the D/A converter 115. The D/A converter 115 converts and transfers the received digital signals into analog signals and selects the corresponding gray scale voltages to transfer the analog signals to the analog output buffer circuit 116. Then, the analog output buffer circuit 116 amplifies the grays scale voltages to transfer the voltages to the data lines.

Figure 5:
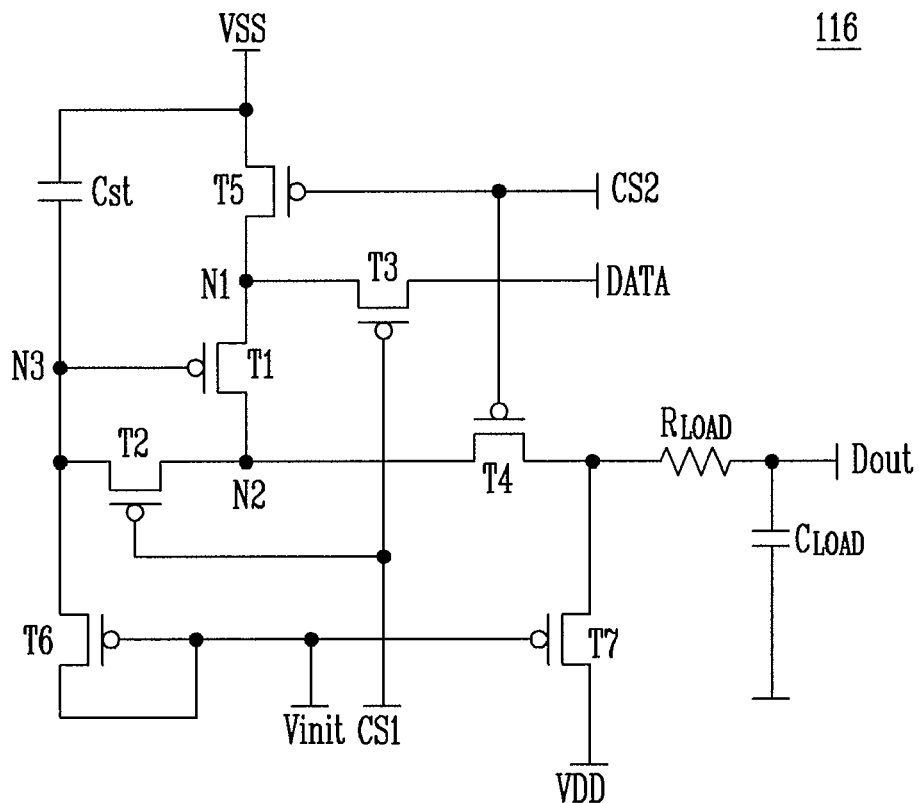
FIG. 5 is a circuit view showing an analog output buffer circuit used in the data driver as shown in FIG. 4.

FIG. 5 is a circuit view showing an analog output buffer circuit used in the data driver as shown in FIG. 4. Referring to FIG. 5, the analog output buffer circuit 116 includes a first transistor T1, a second transistor T2, a third transistor T3, a fourth transistor T4, a fifth transistor T5, a sixth transistor T6, a seventh transistor T7, and a capacitor Cst.

The first transistor T1, of which the source is coupled to a first node N1, the drain is coupled to a second node N2, and the gate is coupled to a third node N3, allows current to flow from the first node N1 to the second node N2 corresponding to the voltage of the third node N3.

The second transistor T2, of which the source is coupled to the third node N3, the drain is coupled to the second node N2, and the gate is coupled to a first control line CS1, generates potential at the second node N2 and the third node N3 by means of a first control signal transferred through the first control line CS1 so that the first transistor T1 is diode-coupled.

The third transistor T3, of which the source is coupled to the data lines, the drain is coupled to the first node N1, and the gate is coupled to the first control line CS1, can allow the data signals DATA to be transferred to the first node N1 in response to the first control signal.

The fourth transistor T4, of which the source is coupled to the second node N2, the drain is coupled to an output terminal, and the gate is coupled to a second control line CS2, can allow the voltage of the second node N2 to be outputted to the output terminal in response to the second control signal.

The fifth transistor T5, of which the source is coupled to the first node N1, the drain is coupled to a first power supply VSS, and the gate is coupled to the second control line CS2, allows the first power supply VSS to be transferred to the first node N1 in response to the second control signal. The first power supply VSS is a voltage in a low state, such as, for example, a ground voltage.

The sixth transistor T6, of which the source and the gate are coupled to each other, is coupled to an initialization power supply line Vinit to receive initialization signals. The drain is coupled to the third node N3.

For the seventh transistor T7, the source is coupled to a second power supply VDD having a voltage in a high state, the drain is coupled to the output terminal, and the gate is coupled to the initialization power supply line Vinit.

The capacitor Cst maintains the voltage of the third node N3 for a time (e.g., a predetermined time) to allow the current to flow from the second node N2 to the first node N1 corresponding to the voltage of the third node N3. The capacitor Cst is coupled to the drain of the sixth transistor T6 to be initialized by receiving the initialization signals.

Figure 6:
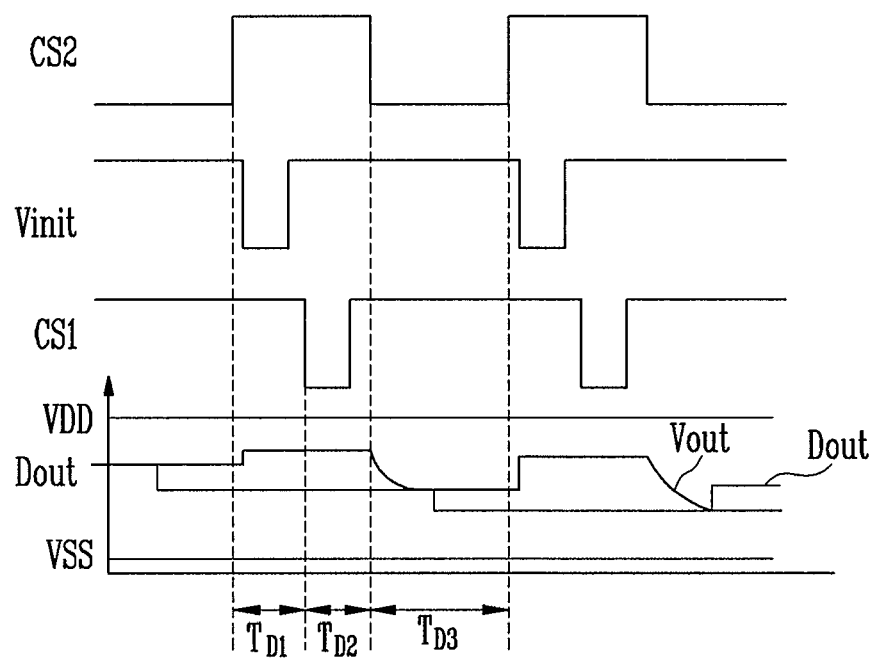
FIG. 6 is a waveform view showing waveforms of signals input/output to an analog output buffer circuit.

FIG. 6 is a waveform view showing waveforms of signals input/output to an analog output buffer circuit. Referring to FIG. 6, the operation of the analog output buffer circuit will be described.

In a first period $T_{D1}$, initialization signals Vinit go to a low state and are transferred to the sixth transistor T6 and the seventh transistor T7 to turn the sixth transistor T6 and the seventh transistor T7 on such that the initialization voltage is transferred to the capacitor Cst and the second power supply VDD is transferred to an output terminal through the seventh transistor T7.

In a second period $T_{D2}$, a first control signal CS1 goes to a low state so that the second transistor T2 and the third transistor T3 are turned on. When the second transistor T2 is on, the first transistor T1 is diode-coupled, and when the third transistor T3 is on, data signals DATA, transferred through the data lines, are transferred to a first electrode of the capacitor Cst through the first transistor T1 such that the voltage of a second node N2 and the voltage of a third node N3 are represented as shown in the following mathematical equation 2.

$$V_{N2}=V_{data}-V_{th1}$$

$$V_{N3}=V_{data}-V_{th1} \qquad \text{Mathematical Equation 2}$$

Herein, $V_{N2}$ represents the voltage of the second node, $V_{N3}$ represents the voltage of the third node, $V_{data}$ represents the voltage of the data signals DATA, and $V_{th1}$ represents the threshold voltage of the first transistor.

In a third period $T_{D3}$, the second control signal CS2 goes to a low state so that the fourth transistor T4 and the fifth transistor T5 are turned on, and the voltage VSS of the first power supply is transferred to the first node N1 and the voltage of the first node N1 is outputted to the output terminal. At this time, the voltage of the first node N1 becomes a voltage in a low state such as a ground voltage, and when the voltage of the second node N2 and the third node N3 become the same voltage as represented by the mathematical equation 1, current flows from the second node N2 to the first node N1 until the second node N2 becomes the voltage corresponding to the following mathematical equation 3.

$$V_{N2}=V_{data}-V_{th1}+V_{th1}=V_{data} \qquad \text{Mathematical Equation 3}$$

Therefore, the voltage of the second node has the voltage of $V_{data}$ and the data voltage compensating for the threshold voltage is output to the output terminal. That is, the voltage of the second node has the voltage reduced by the threshold voltage by means of the voltage of the third node.

Figure 2:
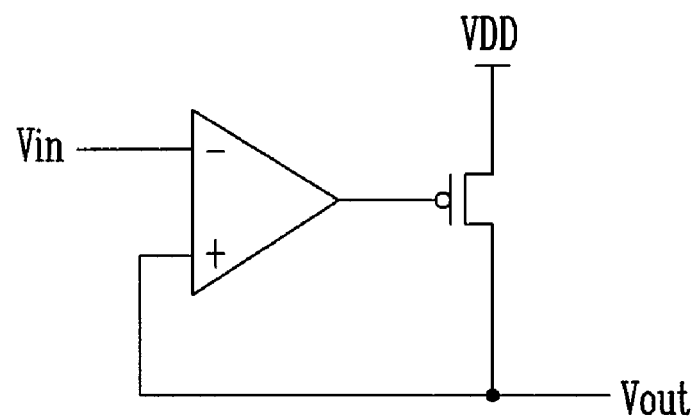
FIG. 2 is a view showing a comparator type of an analog output buffer circuit.
Figure 7:
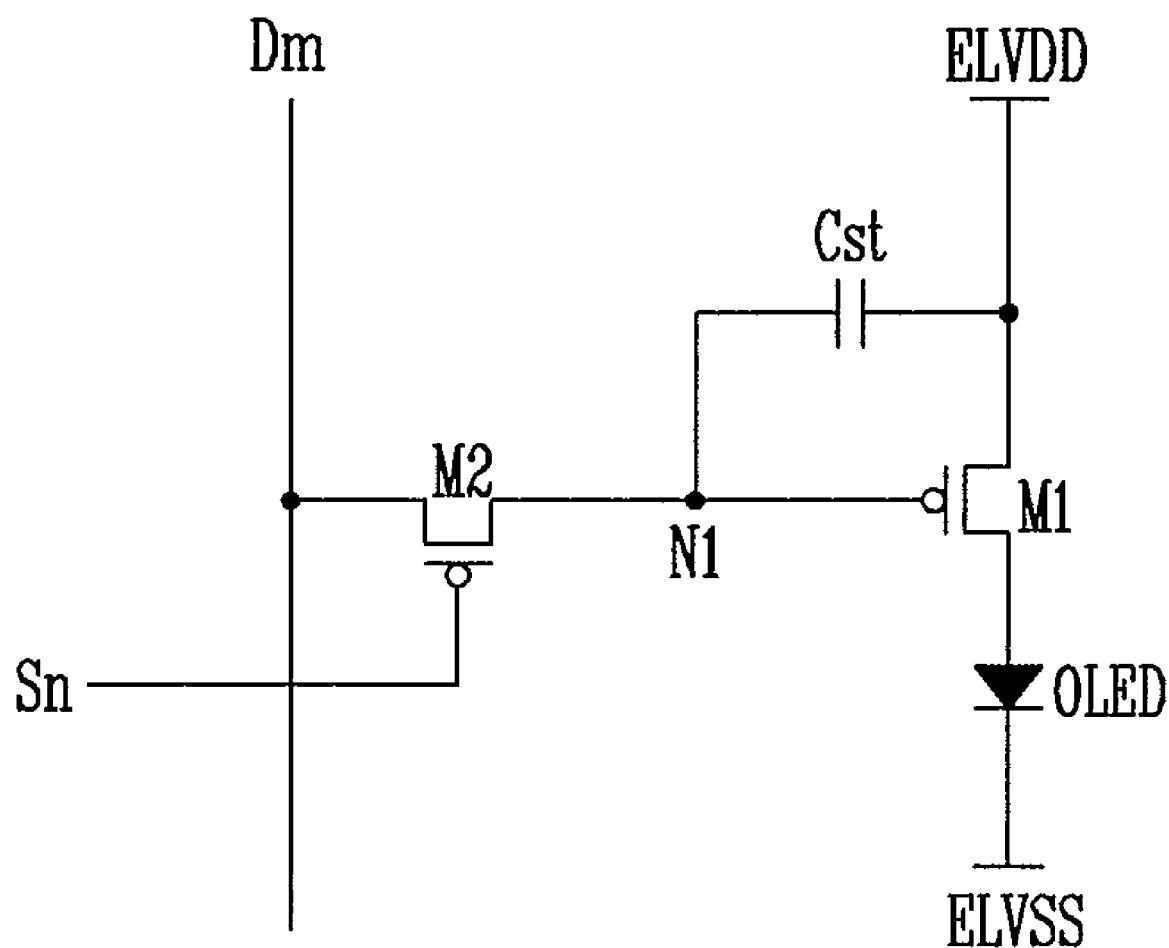
FIG. 7 is a circuit view showing pixels used in the organic light emitting display as shown in FIG. 2.

FIG. 7 is a circuit view showing pixels adopted for the organic light emitting display as shown in FIG. 2. Referring to FIG. 7, pixels are coupled to data line Dm, scan line Sn, and pixel power supply lines ELVDD, and include a first transistor M1, a second transistor M2, a capacitor Cst, and an OLED.

The source of the first transistor M1 is coupled to the pixel power supply line ELVDD, the drain is coupled to the anode of the OLED, and the gate is coupled to the first node N1. The source of the second transistor M2 is coupled to the data line Dm, the drain is coupled to the first node N1, and the gate is coupled to the scan line Sn. The capacitor Cst is coupled between the first node N1 and the pixel power supply line ELVDD to maintain the voltage between the first node N1 and the pixel power supply line ELVDD for a time (e.g., a predetermined time). The OLED includes an anode electrode, a cathode electrode and a light emitting layer, wherein the anode electrode is coupled to the drain of the first transistor M1 and the cathode electrode is coupled to the power supply ELVSS of low potential so that if current flows from the anode electrode of the OLED to the cathode electrode thereof corresponding to the voltage applied to the gate of the first transistor M1, light is emitted from the light emitting layer and a brightness is controlled corresponding to the current amount.

The analog output buffer circuit and the organic light emitting display thereof according to the present invention can compensate for the threshold voltage of the transistor to make the output signals output from the buffer output terminal uniform, thereby making it possible to improve picture quality of the organic light emitting display.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An analog output buffer circuit comprising:
   a first transistor having a source coupled to a first node, a drain coupled to a second node, and a gate coupled to a third node;
   a second transistor coupled between the second node and the third node such that the first transistor is diode-coupled when the second transistor is on, the second transistor having a gate coupled to a first control line to receive a first control signal;
   a third transistor having a source coupled to a data line and configured to receive a data signal from the data line, a drain directly coupled to the first node, and a gate coupled to the first control line;
   a fourth transistor having a source coupled to the second node, a drain coupled to an output terminal, and a gate coupled to a second control line to receive a second control signal different from the first control signal;
   a fifth transistor having a source coupled to the first node, a drain coupled to a first power supply, and a gate coupled to the second control line; and
   a capacitor coupled between the third node and the first power supply and configured to receive the data signal through the first transistor.

2. The analog output buffer circuit as claimed in claim 1, further comprising a sixth transistor coupled to a first electrode of the capacitor and an initialization power supply to transfer an initialization voltage to the first electrode of the capacitor.

3. The analog output buffer circuit as claimed in claim 2, further comprising a seventh transistor coupled between the output terminal and a second power supply having a voltage greater than a voltage of the first power supply such that the voltage of the second power supply is transferred to the output terminal when the seventh transistor is turned on by the initialization voltage.

4. The analog output buffer circuit as claimed in claim 1, wherein a voltage of the second node is outputted to the output terminal when the voltage of the second node is greater than a voltage of the third node by at least a threshold voltage of the first transistor.

5. A data driver comprising:
   a shift register for serially outputting control signals;
   a latch unit for receiving digital data signals serially according to the control signals and for outputting the digital data signals in parallel;
   a D/A converter for converting the digital data signals into data voltages; and
   an analog output buffer circuit for outputting the data voltages,
   wherein the analog output buffer circuit comprises:
      a first transistor having a source coupled to a first node, a drain coupled to a second node, and a gate coupled to a third node;
      a second transistor coupled between the second node and the third node such that the first transistor is diode-coupled when the second transistor is on, the second transistor having a gate coupled to a first control line to receive a first control signal;
      a third transistor having a source coupled to a data line and configured to receive the data voltages from the data line, a drain directly coupled to the first node, and a gate coupled to the first control line;
      a fourth transistor having a source coupled to the second node, a drain coupled to an output terminal, and a gate coupled to a second control line to receive a second control signal different from the first control signal;

a fifth transistor having a source coupled to the first node, a drain coupled to a first power supply, and a gate coupled to the second control line; and a capacitor coupled between the third node and the first power supply and configured to receive the data signal through the first transistor.

6. The data driver as claimed in claim 5, wherein the analog output buffer circuit further comprises a sixth transistor coupled to a first electrode of the capacitor and an initialization power supply to transfer an initialization voltage to the first electrode of the capacitor.

7. The data driver as claimed in claim 6, wherein the analog output buffer circuit further comprises a seventh transistor coupled between the output terminal and a second power supply having a voltage greater than a voltage of the first power supply such that the voltage of the second power supply is transferred to the output terminal when the seventh transistor is turned on by the initialization voltage.

8. The data driver as claimed in claim 5, wherein a voltage of the second node is outputted to the output terminal when the voltage of the second node is greater than a voltage of the third node by at least a threshold voltage of the first transistor.

9. An organic light emitting display comprising:
a display area for receiving data signals and scan signals and displaying images;
a data driver for transferring the data signals to the display area; and
a scan driver for transferring the scan signals to the display area,
wherein the data driver comprises:
a shift register for serially outputting control signals;
a latch unit for receiving digital data signals serially according to the control signals and for outputting the digital data signals in parallel;
a D/A converter for converting the digital data signals into data voltages; and
an analog output buffer circuit for outputting the data voltages,
wherein the analog output buffer circuit comprises:

a first transistor having a source coupled to a first node, a drain coupled to a second node, and a gate coupled to a third node;
a second transistor coupled between the second node and the third node such that the first transistor is diode-coupled when the second transistor is on, the second transistor having a gate coupled to a first control line to receive a first control signal;
a third transistor having a source coupled to a data line and configured to receive the data voltages from the data line, a drain directly coupled to the first node, and a gate coupled to the first control line;
a fourth transistor having a source coupled to the second node, a drain coupled to an output terminal, and a gate coupled to a second control line to receive a second control signal different from the first control signal;
a fifth transistor having a source coupled to the first node, a drain coupled to a first power supply, and a gate coupled to the second control line; and
a capacitor coupled between the third node and the first power supply and configured to receive the data signal through the first transistor.

10. The organic light emitting display as claimed in claim 9, wherein the analog output buffer circuit further comprises a sixth transistor coupled to a first electrode of the capacitor and an initialization power supply to transfer an initialization voltage to the first electrode of the capacitor.

11. The organic light emitting display as claimed in claim 10, wherein the analog output buffer circuit further comprises a seventh transistor coupled between the output terminal and a second power supply having a voltage greater than a voltage of the first power supply such that the voltage of the second power supply is transferred to the output terminal when the seventh transistor is turned on by the initialization voltage.

12. The organic light emitting display as claimed in claim 9, wherein a voltage of the second node is outputted to the output terminal when the voltage of the second node is greater than a voltage of the third node by at least a threshold voltage of the first transistor.

* * * * *